United States Patent
Hammond et al.

(10) Patent No.: US 10,879,479 B2
(45) Date of Patent: Dec. 29, 2020

(54) SYSTEMS AND METHODS FOR ORGANIC SEMICONDUCTOR DEVICES WITH SPUTTERED CONTACT LAYERS

(71) Applicants: SolarWindow Technologies, Inc., Vestal, NY (US); Alliance for Sustainable Energy, LLC, Golden, CO (US)

(72) Inventors: Scott R. Hammond, Seattle, WA (US); Marinus Franciscus Antonius Maria van Hest, Lakewood, CO (US)

(73) Assignees: SolarWindow Technologies, Inc., Vestal, NY (US); Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 16/081,390

(22) PCT Filed: Mar. 3, 2017

(86) PCT No.: PCT/US2017/020676
§ 371 (c)(1),
(2) Date: Aug. 30, 2018

(87) PCT Pub. No.: WO2017/152060
PCT Pub. Date: Sep. 8, 2017

(65) Prior Publication Data
US 2019/0103570 A1  Apr. 4, 2019

Related U.S. Application Data

(60) Provisional application No. 62/304,078, filed on Mar. 4, 2016.

(51) Int. Cl.
*H01L 51/44*  (2006.01)
*H01L 51/00*  (2006.01)
(Continued)

(52) U.S. Cl.
CPC ........ *H01L 51/442* (2013.01); *H01L 51/0008* (2013.01); *H01L 51/0021* (2013.01);
(Continued)

(58) Field of Classification Search
CPC ............. H01L 51/5253; H01L 51/0097; H01L 51/524; H01L 51/56; H01L 2251/5338;
(Continued)

(56) References Cited

U.S. PATENT DOCUMENTS

2007/0138949 A1*  6/2007  Yoshida ............... H01L 51/5253
                                                       313/504
2007/0170535 A1  7/2007  de Rochemont
(Continued)

FOREIGN PATENT DOCUMENTS

CN   102587792 A   7/2012
CN   102945869 A   2/2013
(Continued)

OTHER PUBLICATIONS

International Searching Authority, "International Preliminary Report on Patentability from PCT Application No. PCT/US2017/020676 dated Sep. 13, 2018;" From PCT Counterpart of U.S. Appl. No. 16/081,390; pp. 1-17; Published in WO.
(Continued)

*Primary Examiner* — Jonathan Han
(74) *Attorney, Agent, or Firm* — Fogg & Powers LLC

(57) ABSTRACT

Systems and methods for organic semiconductor devices with sputtered contact layers are provided. In one embodiment, an organic semiconductor device comprises: a first contact layer (140) comprising a first sputter-deposited transparent conducting oxide; an electron transport layer (130) interfacing with the first contact layer; a second contact layer (110) comprising a second sputter-deposited transparent conducting oxide; a hole transport layer inter-
(Continued)

facing with the second contact layer; and an organic semiconductor active layer (120) having a first side facing the electron transport layer and an opposing second side facing the hole transport layer; wherein either the electron transport layer or the hole transport layer comprises a buffering transport layer.

14 Claims, 8 Drawing Sheets

(51) Int. Cl.
  *H01L 51/52* (2006.01)
  *H01L 51/50* (2006.01)

(52) U.S. Cl.
  CPC ...... *H01L 51/5012* (2013.01); *H01L 51/5056* (2013.01); *H01L 51/5072* (2013.01); *H01L 51/5215* (2013.01); *H01L 51/5234* (2013.01); *H01L 2251/305* (2013.01); *H01L 2251/308* (2013.01); *Y02E 10/549* (2013.01)

(58) Field of Classification Search
  CPC ......... H01L 2251/5361; H01L 27/3202; H01L 27/3204
  USPC ......... 257/40; 438/16, 26, 28, 34, 46, 82, 99
  See application file for complete search history.

(56) References Cited

U.S. PATENT DOCUMENTS

| | | | |
|---|---|---|---|
| 2010/0012166 A1* | 1/2010 | Yamanaka | H01G 9/2063 136/244 |
| 2011/0259409 A1 | 10/2011 | Naito et al. | |
| 2012/0241889 A1 | 9/2012 | Takemura et al. | |
| 2013/0037089 A1 | 2/2013 | Sasaki et al. | |
| 2013/0146132 A1 | 6/2013 | Kuchiyama et al. | |
| 2013/0255780 A1* | 10/2013 | Iwanaga | H01L 51/0036 136/263 |
| 2014/0003038 A1 | 1/2014 | Kim et al. | |
| 2014/0216520 A1 | 8/2014 | Chiu et al. | |
| 2014/0256081 A1* | 9/2014 | Hammond | H01L 51/4253 438/82 |
| 2015/0325797 A1* | 11/2015 | Choi | C07D 409/14 257/40 |
| 2016/0005980 A1* | 1/2016 | Ito | C09B 1/00 257/40 |
| 2016/0049608 A1* | 2/2016 | Hack | H01L 51/5203 257/40 |
| 2016/0056412 A1* | 2/2016 | Hirosawa | H01L 51/5253 257/40 |
| 2016/0118519 A1 | 4/2016 | Yang et al. | |

FOREIGN PATENT DOCUMENTS

| | | |
|---|---|---|
| CN | 103296114 A | 9/2013 |
| EP | 2328177 A2 | 6/2011 |
| JP | 2011243438 A | 12/2011 |
| JP | 2014207321 A | 10/2014 |
| JP | 2016027634 A | 2/2016 |
| WO | 0065670 A1 | 11/2000 |
| WO | 2010133279 A1 | 11/2010 |

OTHER PUBLICATIONS

International Searching Authority, "Invitation to Pay Additional Fees and Partial Search Report from PCT Application No. PCT/US2017/020676 dated Jun. 6, 2017;" From PCT Counterpart of U.S. Appl. No. 16/081,390; pp. 1-24; Published in WO.

Anthony, "Corning Willow Glass used to make flexible solar power roofing shingles, could lower the cost of solar power significantly", "retrieved Jan. 28, 2016 from Full Web Address in Notes", Jul. 3, 2013, pp. 1-14.

Bush et al., "Thermal and Environmental Stability of Semi-Transparent Perovskite Solar Cells for Tandems Enabled by a Solution-Processed Nanoparticle Buffer Layer and Sputtered Ito Electrode", "Advanced Materials", Feb. 16, 2016, pp. 1-7.

Corning, "Thin and flexible glass substrate for ultra-slim displays", "retrieved Feb. 26, 2016 from https://www.corning.com/worldwide/en/products/display-glass/products/corning-willow-glass.html", , pp. 1-2.

International Searching Authority, "International Search Report from PCT Application No. PCT/US2017/020676 filed Mar. 3, 2017", "from Foreign Counterpart of U.S. Appl. No. 62/304,078", dated Jul. 31, 2017, pp. 1-28, Published in WO.

* cited by examiner

JV Curve of Monolithic Series-Connected Module, with IZO top TCO forming Interconnect, under simulated AM1.5 Illumination at 1 Sun intensity

SYSTEMS AND METHODS FOR ORGANIC SEMICONDUCTOR DEVICES WITH SPUTTERED CONTACT LAYERS

CROSS-REFERENCE TO RELATED APPLICATIONS

This patent application is a 371 U.S. National Stage application of International Patent Application No. PCT/US2017/02676, filed on Mar. 3, 2017 and titled "SYSTEMS AND METHODS FOR ORGANIC SEMICONDUCTOR DEVICES WITH SPUTTERED CONTACT LAYERS" which claims the benefit of U.S. Provisional Application No. 62/304,078 filed Mar. 4, 2016, and titled "SYSTEMS AND METHODS FOR ORGANIC SEMICONDUCTOR DEVICES WITH SPUTTERED CONTACT LAYERS", the contents of both of which are incorporated herein by reference in their entirety.

GOVERNMENT RIGHTS

The United States Government has rights in this invention under Contract No. DE-AC36-08G028308 between the United States Department of Energy and the Alliance for Sustainable Energy, LLC, the manager and operator of the National Renewable Energy Laboratory.

This patent application is a 371 U.S. National Stage application of International Patent Application No. PCT/US2017/020676, filed on Mar. 3, 2017 and titled "SYSTEMS AND METHODS FOR ORGANIC SEMICONDUCTOR DEVICES WITH SPUTTERED CONTACT LAYERS" which claims the benefit of U.S. Provisional application No. 62/304,078 filed Mar. 4, 2016, and titled "SYSTEMS AND METHODS FOR ORGANIC SEMICONDUCTOR DEVICES WITH SPUTTERED CONTACT LAYERS", the contents of both of which are incorporated herein by reference in their entirety.

JOINT RESEARCH AGREEMENT

The presently claimed invention was made by or on behalf of the below listed parties to a joint research agreement. The joint research agreement was in effect on or before the date the claimed invention was made and the claimed invention was made as a result of activities undertaken within the scope of the joint research agreement. The parties to the joint research agreement are SolarWindow Technologies, Inc. and Alliance for Sustainable Energy, LLC.

BACKGROUND

Semi-transparent semiconductor devices have the characteristic of allowing at least some light in the spectrum of visible light to pass completely through the device. For many semi-transparent semiconductor devices, it is desired to have as much visible light as possible pass completely through the device so that it appears to human beings as either transparent, or mostly transparent with only a moderate visible tint. In order for visible light to enter and leave the device, each of the layers of the device, including the front and back electrical contact layers, must allow this visible light to pass through. The deposition of metal layers, such as a silver metal alloy layer for example, often used to form the front and back electrical contacts of semiconductor devices, will not work in these applications because the deposited metals will significantly or completely block the passage of light. For that reason, transparent contact layers (TCLs), using material such as transparent conducting polymers or transparent conducting oxides have been developed.

Other considerations in the selection of contact layer materials for semi-transparent semiconductor devices are the conductivity and sheet resistance that will be provided by the contact layers. For the purpose of developing laboratory research devices, such as experimental semi-transparent photo-voltaic (PV) devices for example, it can be acceptable for the sheet resistances of front and back contacts to be relatively high because the devices themselves are small in scale. For example, a typical semi-transparent lab photovoltaic cell may be on the order of 3×3 mm. At this scale, sheet resistances only minimally affects the operation of the device because generated charge currents need only travel a short distance across the contact layer surfaces to reach the edges of the cells to be collected and used. For industrial scale applications, in contrast, PV devices need to be manufactured that cover an area on the order of several square meters. Typically for such industrial scale applications, PV devices are made from smaller PV cells that are electrically coupled together into modules in order to cover the larger area. At these larger scales, sheet resistances that might be acceptable for lab PV cells will have a significant adverse effect on the operating characteristics of the larger devices. When sheet resistance limits the size of the individual component cells that make up a module to smaller cells, a greater number of inter-cell electrical interconnects are needed to connect the cells. This decreases the geometric fill factor of the device (which refers to the ratio of active current producing semiconductor material to non-active interconnect material), which ultimately limits the power that the device is capable of producing. As such, it is desirable to have the constituent cells as large as possible so that the electrical interconnects between cells can be spaced as far apart as possible.

In the art today, a typical configuration for a semi-transparent research scale organic photovoltaic (OPV) cell will sometimes comprise a transparent conductive oxide (TCO) for the back contact layer which is deposited over an inert substrate (such as a layer of glass). It may also comprise a transparent high conductivity polymer, such as PEDOT:PSS for the front contact layer. Materials with higher conductivity, when used as semiconductor device contact layers, provide lower sheet resistance for a given visible light transmission value. While transparent conductive oxides can provide both desirable visible light transmission (VLT) characteristics and low sheet resistances, transparent polymers (even those doped to have higher conductivities such as PEDOT:PSS) tend to provide unsatisfactory sheet resistances. For example, a PEDOT:PSS material front contact layer may exhibit a sheet resistance in the range of 100-500 ohms/square while sputtered TCO materials that may be used for back contact layers can achieve sheet resistance of 8 ohms/square or even less. Conventional wisdom in the field of organic semiconductor devices, however, teaches that sputter-deposition of materials onto an organic device will diminish the device's ability to operate. That is, ion bombardment caused by the sputtering process will damage the underlying polymers in the organic semiconductor active layer to the point that the active layer is no longer operable as an electronic device.

For the reasons stated above and for other reasons stated below which will become apparent to those skilled in the art upon reading and understanding the specification, there is a need in the art for realizing high conductivity, high VLT, and low sheet resistance contact layers to enable industrial scale semi-transparent organic semiconductor devices.

SUMMARY

The embodiments of the present disclosure provide methods and systems for organic semiconductor devices having sputtered contact layers and will be understood by reading and studying the following specification.

Systems and methods for organic semiconductor devices with sputtered contact layers are provided. In one embodiment, an organic semiconductor device comprises: a first contact layer comprising a first sputter-deposited transparent conducting oxide; an electron transport layer interfacing with the first contact layer; a second contact layer comprising a second sputter-deposited transparent conducting oxide; a hole transport layer interfacing with the second contact layer; and an organic semiconductor active layer having a first side facing the electron transport layer and an opposing second side facing the hole transport layer; wherein either the electron transport layer or the hole transport layer comprises a buffering transport layer.

DRAWINGS

Embodiments of the present disclosure can be more easily understood and further advantages and uses thereof more readily apparent, when considered in view of the description of the preferred embodiments and the following figures in which.

In accordance with common practice, the various described features are not drawn to scale but are drawn to emphasize features relevant to the present disclosure. Reference characters denote like elements throughout figures and text.

DETAILED DESCRIPTION

Figure 1:
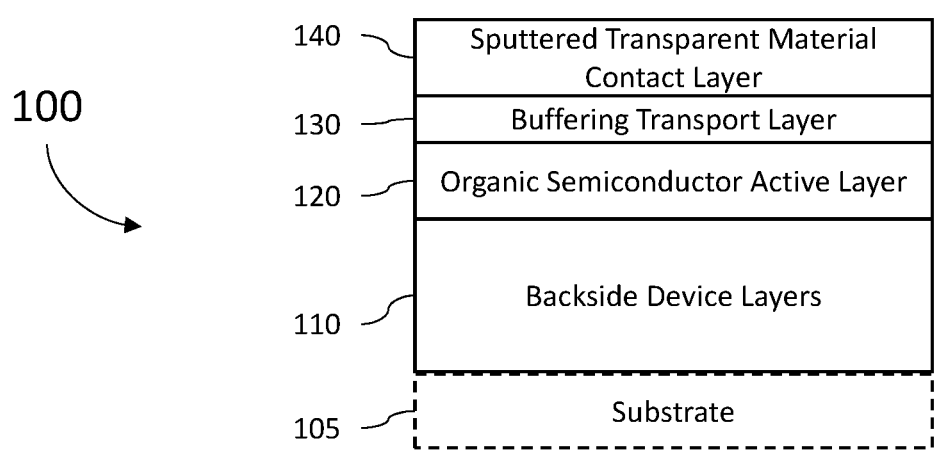
FIG. 1 is a diagram of an organic semiconductor device of one embodiment of the present disclosure.

In the following detailed description, reference is made to the accompanying drawings that form a part hereof, and in which are shown specific illustrative examples in which embodiments may be practiced. These embodiments are described in sufficient detail to enable those skilled in the art to practice the described embodiments, and it is to be understood that other embodiments may be utilized and that logical, mechanical and electrical changes may be made without departing from the scope of the embodiments of the present disclosure. The following detailed description is, therefore, not to be taken in a limiting sense.

Embodiments of the present disclosure provide a process of sputter depositing semi-transparent contact material layers, such as TCOs, onto organic semiconductor active layers to realize organic semiconductor devices that possess high conductivity, high VLT, and low sheet resistance TCLs at one or both the front and back contacts of the device. More specifically, embodiments of the present disclosure introduce a non-sacrificial buffering layer that is deposited over the organic semiconductor active layer prior sputtering of a TCO contact layer onto the device. The term "non-sacrificial" as used herein refers to the characteristic that the buffer layer is not a layer that is subsequently removed by the sputtering or other subsequent processing step, but will remain as an integral, operating part of the resulting device. More specifically, the non-sacrificial buffering layer can further serve as a charge transport layer in the final device (further discussed below) and for that reason is also referred to as a buffering transport layer herein. The buffering transport layer protects the organic semiconductor active layer during the sputter deposition of the contact layer, but can itself withstand the damage from the ion bombardment during sputtering so that it remains operable to function as a charge transport layer without detrimental effects to the overall electronic performance of the resulting organic device. As such, semi-transparent organic devices incorporating two transparent conducting oxides are possible through the embodiments describe herein, where one such layer is sputter-deposited as the front contact.

In addition to providing a front and/or back contact layer for an organic device having the desirable high conductivity, high VLT, and low sheet resistance characteristics discussed above, sputter-deposited TCO layers can also serve as oxygen and water diffusion barriers that are superior to organic polymer diffusion barriers. Finally, as further discussed below, the ability to sputter deposit materials onto organic semiconductor layers creates fabrication options for applications beyond organic photovoltaic (OPV) devices and semi-transparent organic devices. For example, organic electronic devices such as organic light emitting diodes may be fabricated with TCO front contacts, and other organic devices, such as for example organic transistors, may be fabricated with sputter-deposited (or "sputtered") material layers deposited over organic semiconductor active layers. As the terms are used herein, a device or layer that is referred to as "transparent" or "semi-transparent" means that at least some quantity of photons visible to human beings (generally considered to be light in the wavelength range of approximately 380 nm to 680 nm and referred to as the visible light spectrum) completely penetrate through the device or layer without being absorbed. The terms "Visible Light Transmission" or "VLT" refers to the percent of photons having wavelengths falling within the visible light spectrum that pass through a device or layer without being absorbed. Referring to an element as semi-transparent means that the element has a VLT of less than 100% across the visible light spectrum, but greater than 0%.

Generally speaking, the "front" side of an organic semiconductor device typically refers to the side where photons enter the device (for a photovoltaic device) or are emitted from the device (for a light emitting diode application) and the "back" side of the device refers to the opposite side that is either opaque or designed to reflect photons back into the device. It should be appreciated that in this regard, the designation of "front" and "back" sides for a semi-transparent device is somewhat arbitrary as light may enter (or leave) from either side. For clarity, as the terms are used herein, the "back" or "bottom" side of a cell will refer to the side having the substrate on which the device layers are built, and layers between the active layer and the substrate. The "front" or "top" side will refer to those layers built on the opposite side of the active layer relative to the position of the back layers.

FIG. 1 is a diagram illustrating an organic semiconductor device 100 of one embodiment of the present disclosure. In device 100, one or more backside device layers 110 are deposited on a substrate 105. Device 100 further includes at least one layer of organic semiconductor materials deposited onto the backside device layers 110 to form an organic semiconductor active layer 120, a buffering transport layer 130 that is deposited onto the organic semiconductor active layer 120, and a sputtered transparent material contact layer 140 that is sputter-deposited over the buffering transport layer 130. In some embodiments, device 100 is at least semi-transparent to the visible light spectrum meaning that at least some light visible to human beings can penetrate completely through the device. In some alternate implementations of this embodiment, the substrate layer 105 may be optionally removed such that the final device 100 may, or may not, include the presence of a substrate layer 105.

The particular composition of the backside device layers 110 will vary depending on the intended function of device 100, but in most cases will comprise at least a charge transport layer (that is, either a hole transport layer (HTL) or an electron transport layer (ETL), and a back contact layer typically located at the interface with the substrate 105. The materials forming the backside device layers 110 may be sputter-deposited or deposited by other suitable methods such as but not limited to evaporative/vapor deposition or solution-processing methods. The exact composition of the organic semiconductor active layer 120 can vary, but may include, for example, a bulk heterojunction (BHJ) layer comprising a blend of an electron donor material (which may be a polymer and/or small molecules) and at least one electron acceptor material (which in different implementations may be a fullerene or other small molecule or polymer). Alternately the organic semiconductor active layer 120 may comprise a bilayer layer having a layered structure of electron donor material and electron acceptor material.

As mentioned above, buffering transport layer 130 serves the dual functions of protecting the structures of the organic semiconductor active layer 120 during fabrication while the sputtered transparent contact layer 140 is sputtered onto device 100, and functioning as a charge transport layer during operation of device 100.

In some embodiments buffering transport layer 130 comprises a transparent conducting polymer such as but not limited to poly(3,4-ethylenedioxythiophene) (PEDOT) which may be blended with a polystyrene sulfonate (PSS) to dope the organic polymer into a more highly conductive state. It should be noted, however, that since a separate front contact layer 140 will be deposited onto the device, it is not necessary for buffering transport layer 130 to be doped with PSS to any specific level for the purpose of achieving a certain sheet resistance criteria. In other words, the sputtered front contact layer 140 deposited onto the buffering transport layer 130 will provide a transparent material layer having the desired low sheet resistance so that the sheet resistance of the buffering transport layer 130 is not a factor that will affect device operability. It should be understood that reference to a material as being "sputtered" or "sputter-deposited" refers not just to how the material was applied to the previous layer but also refers to the resulting structure of the device, which possesses the physical characteristics that are imparted from the contact layer having been sputter-deposited. For example, the buffering transport layer 130 may show evidence of structural artifacts from ion bombardment induced damage which occurred during sputter deposition of the front contact layer 140 onto the buffering transport layer 130.

One purpose for providing buffering transport layer 130 adjacent to the contact layer 140 is to align energy levels within device 100 to facilitate the migration or flow of one type of charge (i.e., either a hole or electron) to the adjacent contact layer while inhibiting the migration or flow of the opposite charge to that contact layer. For example, for implementations where buffering transport layer 130 is implemented as a hole transport layer, then during the operation of device 100, one purpose of buffering transport layer 130 is to function as a barrier to electrons attempting to flow between the front contact layer 140 and the active layer 120 while at the same time allowing hole charges to flow between contact layer 140 and active layer 120. Similarly, when buffering transport layer 130 is implemented as an electron transport layer, then during operation of device 100, one purpose of the buffering transport layer 130 is to function as a barrier to holes attempting to flow between the front contact layer 140 and the active layer 120 while at the same time allowing electron charges to flow between contact layer 140 and active layer 120. Accordingly, the deposition of buffering transport layer 130 should provide a layer having a thickness and material composition that achieves the desired level of electron and/or hole charge mobility between contact layer 140 and active layer 120. A buffering transport layer 130 of sufficient thickness to operate as a charge transport layer is also sufficient serve to protect the active layer 120 from ion bombardment damage during the sputtering process that deposits the transparent contact layer 140. Any damage to the buffering transport layer 130 caused during the sputtering of transparent contact layer 140 and resulting in degradation of the sheet resistance characteristics of the buffering transport layer 130 is of negligible consequence. This is because the deposition of the sputtered transparent contact layer 140 onto the buffering transport layer 130 provides more favorable sheet resistance characteristics than the material of buffering transport layer 130 was originally capable of providing even prior to the ion bombardment.

Although transparent and/or semi-transparent polymer materials such as PEDOT:PSS have been mentioned as materials which may be used to implement buffering transport layer 130, other materials, such as but not limited to transparent or semi-transparent oxides may be used as a buffering transport layer for device 100 as well. For example, in one embodiment, buffering transport layer 130 comprises a metal oxide which may be deposited through evaporative/vapor deposition or solution-processing methods and which is known to function well as a hole transport layer, such as but not limited to tungsten trioxide ($WO_3$). The thickness of the material forming buffering transport layer 130 will vary with the nature of the different materials chosen for a specific application, but a thickness sufficient to create an operating charge transport layer (which is a selection within the skill of one of ordinary skill in the art) should be sufficient for the layer to also achieve its buffering objective in most circumstances. If a greater thickness is required, then establishing how much more material is needed can be determined by one of ordinary skill in the art who has studied this disclosure through incremental testing without undue experimentation. For example, in one embodiment, a 10-15 nm buffering transport layer of $WO_3$ evaporated onto a bulk-heterojunction active layer is sufficient to act both as a hole collection layer for an OPV device and to shield the active bulk-heterojunction active layer of the OPV device from damage caused by the sputter-deposition of an indium zinc oxide (IZO) front contact onto the WO₃ layer. Similarly, a 50 nm buffering transport layer of PEDOT:PSS cast from solution onto a bulk-heterojunction active layer is sufficient to act both as a hole collection layer for an OPV device and to shield the bulk-heterojunction active layer from damage while sputter-depositing an indium zinc oxide (IZO) front contact onto the device.

As mentioned above, many transparent conducting oxides historically have been used for fabricating back contact layers where the TCO can be sputter-deposited directly onto an inert inorganic substrate 105. In such applications, there is no potential for causing damage to later deposited organic semiconductor layers. Utilization of sputter-deposited TCOs for front contact layers applied after deposition of organic semiconductor active layers has historically been avoided due to concerns about ion damage to the organic semiconductor active layers. However, as presented herein, the introduction of a buffering transport layer 130 can significantly protect the organic semiconductor active layer 120 to permit the later sputter-deposition of a TCO after deposition of organic semiconductor active layer 120.

For example, in some embodiments, sputtered transparent material contact layer 140 comprises a sputtered indium zinc oxide (IZO). Among the various TCO materials that may be utilized to form the sputtered transparent material contact layer 140, IZO is particularly attractive because it can be sputter-deposited at relatively mild temperature, voltage and power compared to other TCOs. However, other TCOs, such as but not limited to indium tin oxide (ITO), Aluminum doped Zinc Oxide (AZO), and Gallium doped Zinc Oxide (GZO) may also be deposited to create a sputtered transparent material contact layer 140. Although the sputtering processes for depositing these alternative TCOs will vary in complexity, it is well within the skill of one of ordinary skill in the art who has studied this disclosure to know or determine from available literature what temperatures and other deposition parameters are needed during sputtering to provide a sputter-deposited layer having a desired conductivity.

With respect to sputtering material onto an organic semiconductor device, the choice of which TCO to use for fabricating the sputtered transparent contact layer 140 is at least partially dependent on the sputtering temperature required to obtain the target conductivity and the effect of that temperature on underlying organic semiconductor layers. In other words, if obtaining a desired conductivity for a given TCO would require sputtering at a temperature exceeding an upper exposure temperature of the specific organic semiconductor material selected for the active layer 120, then either another TCO may need to be selected and/or the device designed to operate with a different top contact conductivity requiring a lower sputtering temperature. IZO is an example of a TCO material that forms an amorphous layer with superior sheet resistances when sputter-deposited at room temperature (for example, about 21° C.) and for that reason, among others, may be applied across a wide selection of different active layer organic materials. ITO in contrast often needs to be sputtered at temperatures approaching 300° C. to obtain desirable conductivities, but sputter-depositing ITO at such elevated temperatures may destroy the polymers of many underlying organic materials. AZO can achieve desirable conductivities when sputtered at temperatures below 300° C., so it may be used to fabricate a sputtered top contact layers over organic layers, where ITO cannot. It should be noted that once the process of sputter-depositing TCO material begins, the sputtered TCO material will accumulate on the buffering transport layer 130 and this accumulation will begin to further protect the underlying organic materials. Therefore once a combination of TCO and buffer transport layer materials are selected for deposition over a given organic semiconductor active layer, selecting the thickness of the TCO deposition may be based on obtaining the desired sheet resistance.

Figure 2:
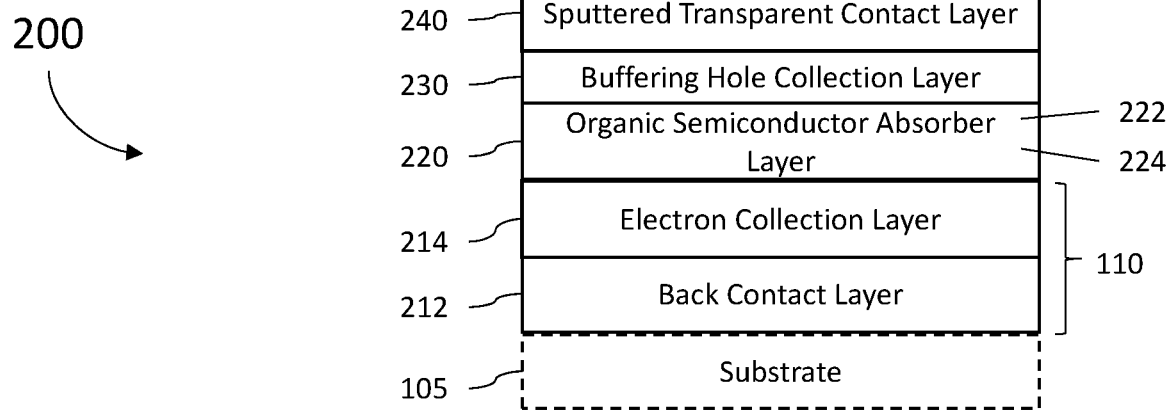
FIG. 2 is a diagram of an organic photovoltaic device of one embodiment of the present disclosure.

FIG. 2 is a diagram illustrating an organic photovoltaic (OPV) device 200, which is a more specific implementation of the generalized organic semiconductor device 100 illustrated in FIG. 1. In this embodiment, the backside device layers 110 deposited onto substrate 105 include a back contact layer 212, and an electron collection layer (ECL) 214. The organic semiconductor active layer 120 of FIG. 1 is implemented in FIG. 2 as an organic semiconductor absorber layer 220 that includes a combination of an electron donor material 222 (which may be a polymer or small molecule) and an electron acceptor material 224 (which may be a fullerene or small molecule or polymer). In some embodiments, the organic semiconductor absorber layer 220 comprises a blend of the electron donor material 222 and the electron acceptor material 224 forming a bulk-heterojunction (BHJ). In other embodiment, the absorber layer 220 may be a bilayer organic absorber layer having the acceptor material 224 and donor material 222 structured as distinct layers. OPV device 200 further includes a buffering transport layer (such as layer 130 in FIG. 1) operating as a buffering hole collection layer 230, and a sputter-deposited transparent contact layer 240. During fabrication of device 200, buffering hole collection layer 230 serves the function of protecting the organic semiconductor absorber layer 220 from damage during sputter-deposition of the sputtered transparent contact layer 240 in the manner described above. In alternate implementations, substrate 105 may comprise a semi-transparent material such as a glass or an opaque material such as a metal. For embodiments where OPV device 200 is intended to be semi-transparent, both back contact layer 212 and front contact layer 240 may comprise sputter-deposited transparent conducting oxides. For non-transparent embodiments where it is desired that one or both of the substrate 105 and the back contact layer 212 are opaque, metallic, or otherwise non-transparent to visible light, the teachings disclosed herein permit utilization of sputter-deposited transparent conducting oxides for fabricating the front contact layer 240.

In OPV device 200, absorber layer 220 is a photovoltaic absorber layer that generates electron and hole charges from absorbed photons. During operation of device 200, buffering hole collection layer 230 functions as a barrier to electrons attempting to migrate to the front contact layer 240 while at the same time allowing hole charges produced in the absorber layer 220 to flow into the front contact layer 240. Similarly, the purpose of the electron collection layer 214 is to function as a barrier to holes attempting to flow to the back contact layer 212 while allowing electrons produced in the organic semiconductor absorber layer 220 to flow into back contact layer 212. The resulting collection of opposing charges accumulating in the back contact layer 212 (negative electron charges) and front contact layer 240 (positive hole charges) manifests a voltage potential across the OPV device 200. Because the novel structure of OPV device 200 includes having both contact layers 220 and 240 fabricated as sputter-deposited transparent conducting oxides, the device has a low sheet resistances across the both surfaces.

This allows industrial scale OPV modules to be fabricated without compromising cell performance or geometric fill factors. In other words, because the electrical resistance to hole and electron current flow across both contact layer surfaces is low, there is less internal voltage loss which in turn allows a greater open circuit voltage to be applied to external loads. The low sheet resistance also leads to improved scalability with respect to OPV cell sizes in OPV modules, which in turn leads to improved OPV module geometric fill factors. For example, for a given OPV module, tripling the size of the module's constituent OPV cells results in a 67% reduction in the number electrical interconnects required by the OPV module. Reducing an OPV module's surface area occupied by electrical interconnects results in a proportional increase in the OPV module's surface area available for electricity generating OPV cells, which in turn results in higher power generating capacities per total unit surface area of the OPV module.

Figure 3:
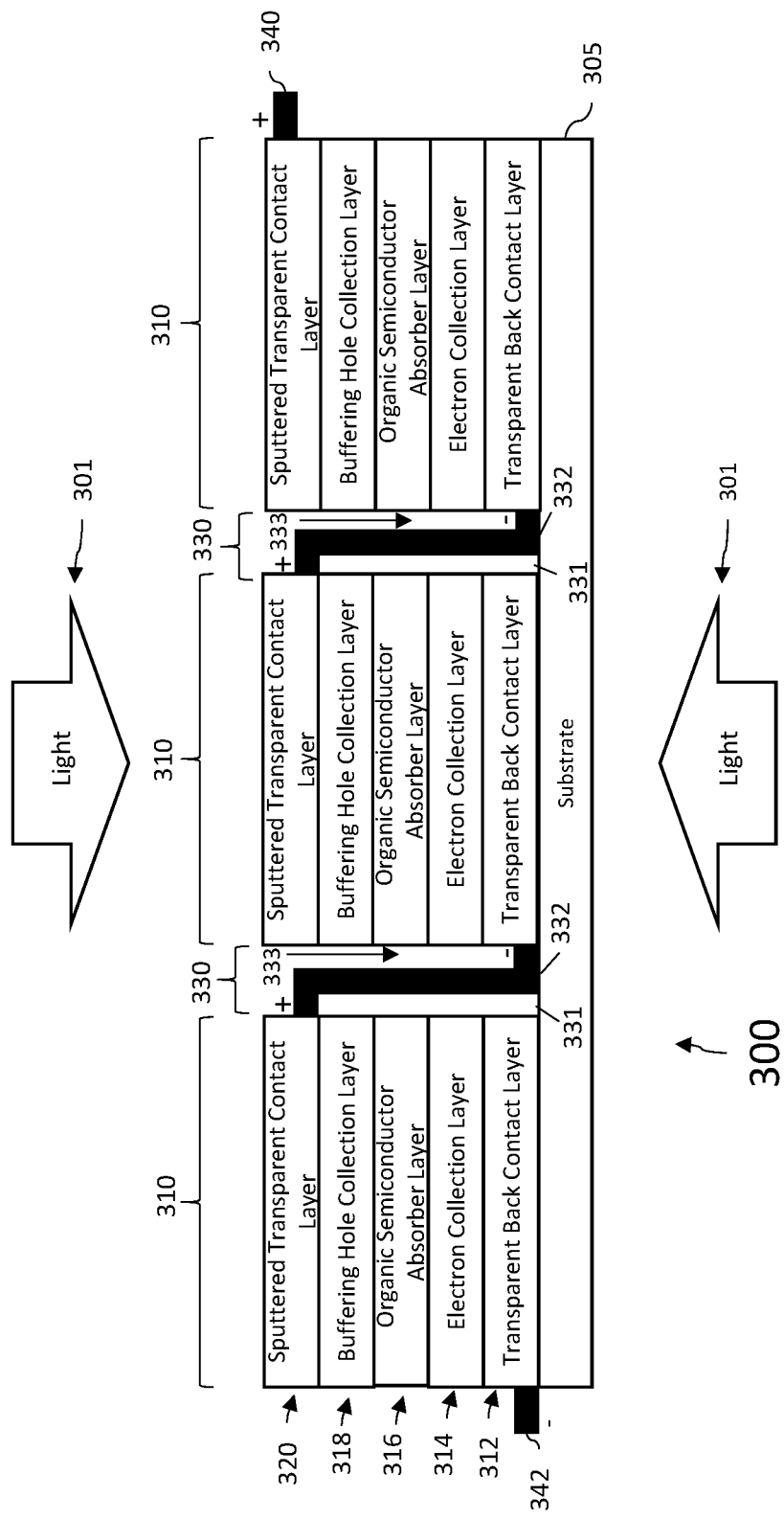
FIG. 3 is a diagram of an organic photovoltaic module of one embodiment of the present disclosure.

FIG. 3 is a diagram illustrating an example OPV module 300 of one embodiment of the present disclosure. In some implementations, OPV module 300 is a semi-transparent organic device which may be used, for example in a building-integrated photovoltaics application (such as a window unit) that allows natural lighting into an interior space of a building or alternately for a window used for a vehicle (such as but not limited to a windshield).

OPV module 300 comprises a plurality of device cells 310 fabricated on a substrate 305. In alternate implementations, substrate 305 may comprise a rigid semi-transparent material such as a glass pane, a sheet of acrylic or acrylic glass, a semi-transparent plastic or film material, or alternately an opaque material such as a metal. Each of the device cells 310 may include the same structure and operate as described above with respect to OPV device 200. In particular, the device cells 310 include front and back contact layers 320 and 312, a buffering hole collection layer 318, an organic semiconductor absorber layer 316 and an electron collection layer 314. For semi-transparent implementations, front and back contact layers 320 and 312 may both comprise sputter-deposited transparent contact layers. For example, front and back contact layers 320 and 312 may comprise sputtered transparent contact layers formed by sputter-depositing TCOs such as but not limited to indium zinc oxide (IZO), indium tin oxide (ITO), Aluminum doped Zinc Oxide (AZO), or Gallium doped Zinc Oxide (GZO).

The organic semiconductor absorber layer 316 of each device cell 310 comprises an electron acceptor material (which may, for example, include a polymer or small molecule) and an electron donor polymer (which may, for example, include a fullerene or other small molecule or polymer). As discussed above, organic semiconductor absorber layer 316 may comprise an organic BHJ absorber layer in some embodiments, and a bilayer organic semiconductor layer in others as mention above.

In OPV device 300, each of the device cells 310 are electrically coupled by electrical interconnects 330. The electrical interconnects 330 may provide for series interconnection of the device cells 310 (as illustrated in FIG. 3) or alternately parallel interconnection of the device cells 310. In some embodiments, the various device layers of the device cells 310 are deposited across the base window material substrate 305 and scribes are cut at least partially into one or more layers during the depositions to form the electrically distinct device cells 310. Subsequent layers of material may then be deposited to create the electrical interconnects 330 between the device cells 310.

In some embodiments, the interconnects 330 may be formed during the sputter-depositing of the contact layer 320 by sputter-depositing the same material used to form contact layer 320 into scribes opened into the prior deposited layers. For example, an electrically insulating material 331 may be deposited into a first space opened up between device cells 310, then the contact layer 320 is sputter-deposited with that electrically conducting material into a second space opened up between device cells 310 to form an electrical connection 332 between neighboring device cell 310. Thus as shown in FIG. 3, the sputter-deposited material electrically connects a front contact layer 320 of one device cell 310 with a back contact layer 312 of a neighboring device cell 310. Finally, a third space may be opened as shown at 333 down to but not through the electrical connection 332 to provide electrical isolation between neighboring device cells 310. Since the material used to form contact layer 320 is a sputter-deposited TCO, in one embodiment the material selected for insulating material 331 may also be a transparent material so that the completed electrical interconnects 330 are also transparent. Even though transparent interconnects 330 do not contribute to the PV electricity generating process, they provide the advantage of allowing light to pass through those regions of device 300 which may be a desirable characteristic in many applications.

When light 301 enters into the OPV cells 310 the absorber layers 316 generate electron and hole charges from absorbed photons. The electron and hole electrical charges are collected in the respective contact layers 320 and 312. The electrical interconnects 330 (which may couple the respective contact layers 320 and 312 in either a serial or parallel configuration) transport the charges to positive and negative electrodes 340 and 342 (which may be positioned, for example, at the edges of OPV module 300). The positive and negative electrodes 340 and 342 may in turn be coupled to one or more electronic devices (for example, electrical loads) in order to provide electrical power to the devices, and/or for storage of the energy generated by OPV module 300.

Figure 4:
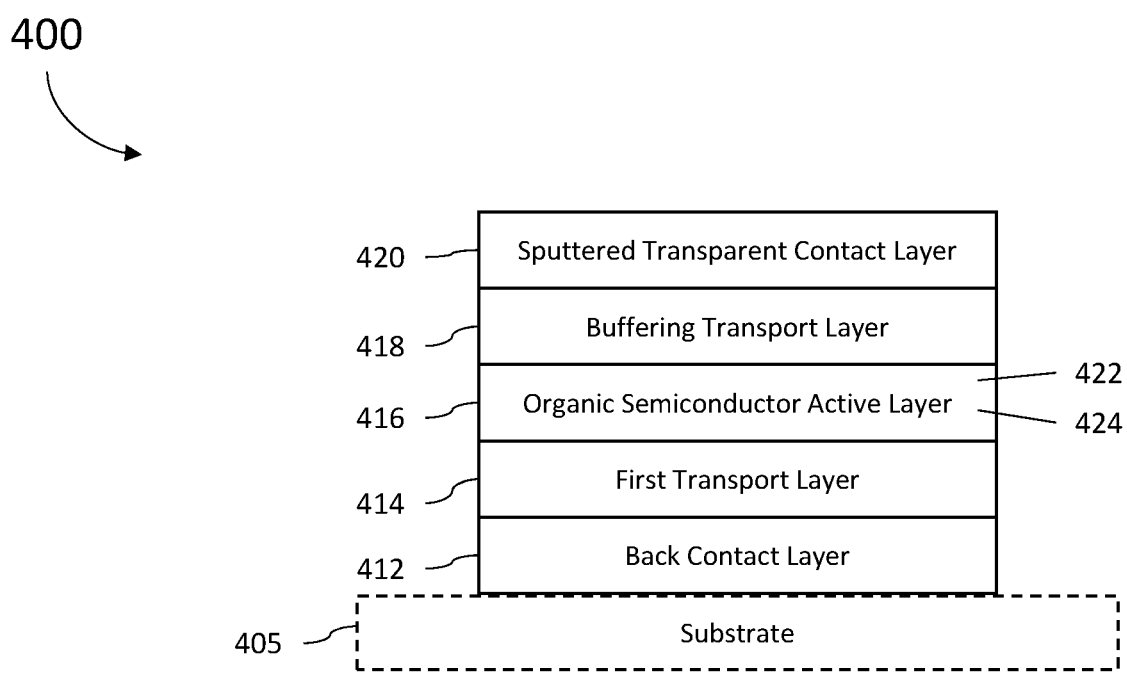
FIG. 4 is a diagram of an organic semiconductor device of one embodiment of the present disclosure.

FIG. 4 is a diagram illustrating another organic semiconductor device 400 of the present disclosure, which provides another specific implementation of the generalized device 100 illustrated in FIG. 1. In this embodiment, the backside device layers (which are shown at 110 in FIG. 1) deposited onto substrate layer 405 and include a back contact layer 412 and a first transport layer 414. In some embodiments, the back contact layer 412 may be a metallic material contact layer. In some embodiments, an organic semiconductor active layer 416 may be implemented as an organic bulk-heterojunction (BHJ) active layer that includes a blend of an electron donor material 422 (which may comprise, for example, a polymer and/or small molecules) and an electron acceptor material 424. In other embodiments, the electron donor copolymer material 422 maybe combined with the electron acceptor material 424 by layering one material on-top of the other to produce a bilayer-structured organic material layer. Depending on the purpose of organic semiconductor device 400, the electron acceptor material 424 may comprise for example, fullerene and/or a fullerene derivative, and/or alternately a polymer or small molecule material. For example, a fullerene, polymer or small molecule material may be appropriate for an OPV or organic photodetector (OPD) application whereas a polymer or small molecule material would be suitable for an organic light emitting diode (OLED) application. As shown in FIG. 4, organic semiconductor device 400 further includes a buffering transport layer 418 and a sputter-deposited transparent contact layer 420 as the front contact layer. In alternate implementations, transparent contact layer 420 may comprise a sputter-deposited TCO such as but not limited to indium zinc oxide (IZO), indium tin oxide (ITO), aluminum doped zinc oxide (AZO), or gallium doped zinc oxide (GZO).

During fabrication of organic semiconductor device 400, buffering transport layer 418 serves the function of protecting the organic semiconductor active layer 416 from damage during sputter-deposition of the transparent contact layer 420 in the manner described above. This structure provides an inverted stack alternative to those devices where transparent contact layers are sputter-deposited onto a substrate, followed by application of a non-transparent metal top contact layer (such as a silver layer) using a vapor deposition or other process. Instead, as shown in FIG. 4, a non-transparent metal material can be deposited onto the substrate 405 to form the back contact layer 412 with a sputter-deposited transparent contact layer 420 applied at the front of the device 400 to permit photons to enter and/or exit.

In some implementations, organic semiconductor device 400 is an OPV device where the organic semiconductor active layer 416 comprises a photovoltaic absorber layer that generates electron and hole charges from absorbed photons as described in the embodiments above. In such a case, the first transport layer 414 may function as a hole collection layer, and the buffering transport layer 418 may function as buffering electron collection layer. In other implementations where organic semiconductor device 400 is a light emitting diode device, then organic semiconductor active layer 416 may comprises an emissive electroluminescent layer that generates photons in response to an electric potential applied across back and front contact layers 412 and 420. In such cases, the back transport layer 414 and buffering front transport layer 418 may each comprise structures that include a combination of transport layer and injection layer as would be understood by one of ordinary skill in the art who has studied this disclosure.

In each of the embodiments mentioned above, by having a sputter-deposited TCO as the front or top contact layer, the devices are also afforded with a favorable oxygen and water diffusion barrier because sputtered oxides have very favorable water vapor transmission properties as compared to those provided by other transparent contacts. For example, organic semiconducting polymers, carbon nanotube meshes, metal grids, and metal nanowire meshes are all common transparent contact alternatives to sputter-deposited TCOs, but all are very permeable to water vapor and oxygen gas, which are known to contribute to rapid degradation of OPV and other organic electronic devices. A single sputter-deposited layer generally has a water vapor transmission rate (WVTR) of $\sim 10^{-2}$ $g/m^2$ day, which is at least 2 orders of magnitude less than polymers such as polyethylene terephthalate (PET). The permeability of a sputter-deposited TCO contact layer can be lowered even further by interleaving other intervening materials (including conductive materials) between multiple sputter-deposited layers, to produce even more effective barriers. Such top-contact barriers can serve as either the primary barrier, or provide a secondary barrier to a different primary barrier, thus providing additional protection to the device in case of primary barrier failure. Thus sputter-deposited TCO-constructed front contacts also provide a means to hermetically seal organic electronic devices by providing oxygen and water barrier layers.

Figure 5:
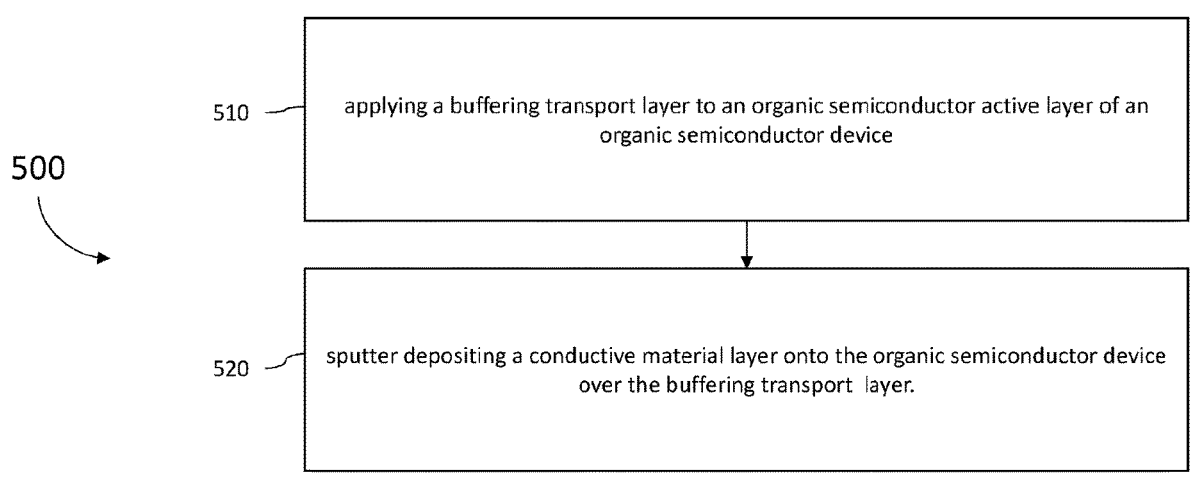
FIG. 5 is a diagram of a method of one embodiment of the present disclosure.

FIG. 5 is a flow chart illustrating a method 500 of one embodiment of the present disclosure. It should be understood that method 500 may be implemented in conjunction with any of the embodiments described above with respect to FIGS. 1, 2, 3 and 4. As such, elements of method 500 may be used in conjunction with, in combination with, or substituted for elements of those embodiments described above. Further, the functions, structures and other description of elements for such embodiments described above may apply to like named elements of method 500 and vice versa.

The method begins at 510 with applying a buffering transport layer to an organic semiconductor active layer of an organic semiconductor device. Applying the buffering transport layer protects the underlying organic semiconductor active layer from damage during the subsequent sputter-deposition of a front contact layer (shown at 520). The buffering transport layer can itself withstand the damage from the ion bombardment that occurs during the sputter-deposition of a front contact layer to still be able to provide a functional charge transport layer without detrimental effects to the overall electronic performance of the resulting organic device. As such, semi-transparent organic devices incorporating two transparent conducting oxides are possible through the embodiments describe herein, where one such layer is sputter-deposited as the front contact. As described above, the organic semiconductor active layer may itself have been previously applied onto one or more backside device layers and a substrate.

The thickness of the material applied at 510 to form the buffering transport layer may vary with the nature of the materials selected, but a thickness sufficient to create an operating charge transport layer (i.e., either a hole transport layer or electron transport layer) should be sufficient for the buffering transport layer to also protecting the underlying organic semiconductor active layer.

The determination of buffering transport layer thickness can be determined by one of ordinary skill in the art who has studied this disclosure through incremental testing without undue experimentation. For example, in some embodiments, a 10-15 nm buffering transport layer of $WO_3$ deposited by evaporative methods onto a bulk-heterojunction active layer is sufficient to act as a hole collection layer for an OPV device. Such a buffering transport layer would also be sufficient to shield an active BHJ layer from damage caused by sputter-deposition of an indium zinc oxide (IZO) front contact layer onto the $WO_3$ buffering conduction layer. In another example embodiment, a 50 nm hole collection layer of PEDOT:PSS solution-cast onto a bulk-heterojunction active layer is sufficient to act as a hole collection layer for an OPV device and also sufficient to shield the active BHJ layer from damage while sputter-depositing an indium zinc oxide (IZO) front contact layer.

The method proceeds to 520 with sputter-depositing a conductive material layer onto the organic semiconductor device over the buffering transport layer. With respect to sputtering this conductive material onto the buffering transport layer, any suitable electrically conductive TCO material may be utilized. The choice of which TCO to use for sputtering may be at least partially dependent on the sputtering temperature required to obtain the target conductivity and that temperature's effect on underlying organic semiconductor layers. For example, a TCO material may be selected that provides the target conductivity needed for a particular application but also provides sputtering temperature that are low enough to not degrade and/or damage the underlying organic semiconductor active layer(s). If obtaining a desired conductivity for a given TCO would require sputtering at a temperature exceeding an upper exposure temperature of the specific organic semiconductor materials selected for the active layer, then either another TCO should be selected, or the device may be designed to operate with a different conductivity requiring a lower sputtering temperature. IZO is an example of a TCO material that forms an amorphous layer with superior sheet resistances when sputter-deposited at room temperature and thus is suitable across a wide range of different organic semiconductor active layer materials. ITO in contrast often needs to be sputtered at temperatures approaching 300° C. to obtain desirable conductivities, but such elevated temperatures may destroy the underlying polymers of many organic semiconductor materials. AZO may achieve desirable conductivities when sputtered at temperatures below 300° C., and may be used to fabricate sputter-deposited top contact layers over organic layers, where ITO cannot. It should be noted that once the process of sputter-depositing TCO material begins at 520, the sputtered TCO material will accumulate on the buffering transport layer 130 and itself begin to further protect the underlying organic materials. Therefore once a combination of TCO and buffer conduction layer materials are selected for deposition over a given organic semiconductor active layer, selecting the thickness of the TCO deposition may be based on obtaining the desired sheet resistance.

Figure 6:
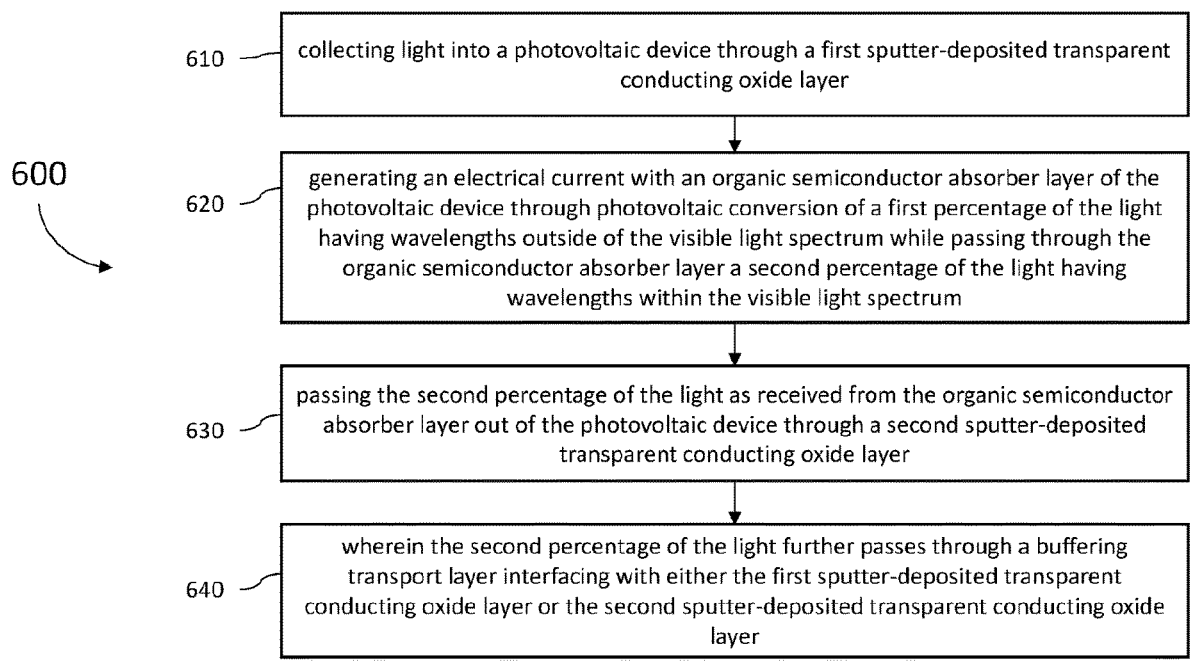
FIG. 6 is a diagram of another method of one embodiment of the present disclosure.

Given the disclosure above, it should be understood that another embodiment flowing from the above described embodiments includes a method for photovoltaic generation of electricity using a device as disclosed from any of the above embodiments. For example, in one embodiment as shown in FIG. 6 at 600, a method comprises: collecting light into a photovoltaic device through a first sputter-deposited transparent conducting oxide layer (shown at 610); generating an electrical current with an organic semiconductor absorber layer of the photovoltaic device through photovoltaic conversion of a first percentage of the light having wavelengths outside of the visible light spectrum while passing through the organic semiconductor absorber layer a second percentage of the light having wavelengths within the visible light spectrum (shown at 620); and passing the second percentage of the light as received from the organic semiconductor absorber layer out of the photovoltaic device through a second sputter-deposited transparent conducting oxide layer (shown at 630); wherein the second percentage of the light further passes through a buffering transport layer interfacing with either the first sputter-deposited transparent conducting oxide layer or the second sputter-deposited transparent conducting oxide layer (shown at 640).

It should also be appreciated that in alternate embodiments to method 600, the method may be implemented using an OPV device where the back contact layer is not a sputter-deposited TCO, but is instead a transparent contact material deposited by some other means such as but not limited to evaporative/vapor deposition or solution-processing methods. That is, the layer of material forming the back transparent contact layer may include, but is not limited to: conducting oxides, metal nanowire meshes, patterned metal grids, carbon nanotube/nanobud meshes, doped highly conducting polymer blends, or combinations thereof. These back contact layers may be deposited onto the substrate using non sputter-depositing techniques with subsequent layers of the OPV stack formed over the back transparent contact layer as described above.

Figure 6A:
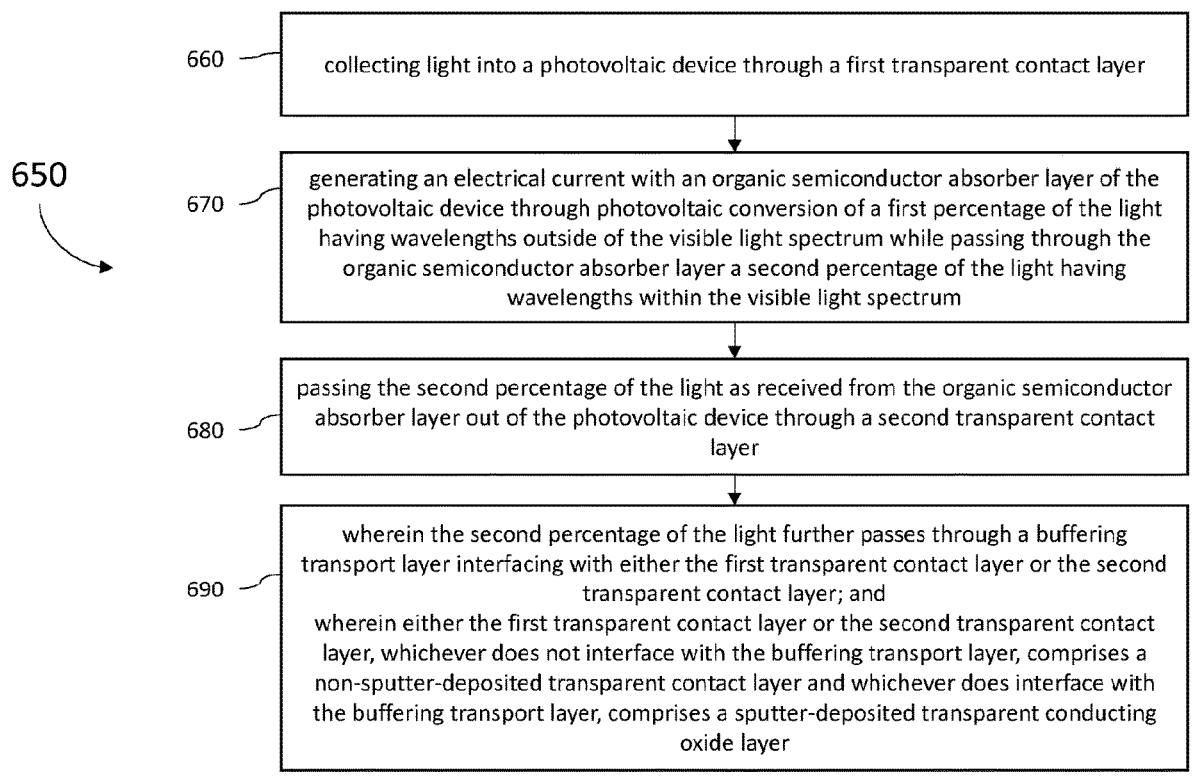
FIG. 6A is a diagram of another method of one embodiment of the present disclosure.

FIG. 6A illustrates an example embodiment of such an alternative method 650. Method 650 begins at 660 with collecting light into a photovoltaic device through a first transparent contact layer and proceeds to 670 with generating an electrical current with an organic semiconductor absorber layer of the photovoltaic device through photovoltaic conversion of a first percentage of the light having wavelengths outside of the visible light spectrum while passing through the organic semiconductor absorber layer a second percentage of the light having wavelengths within the visible light spectrum. The method proceeds to 680 with passing the second percentage of the light as received from the organic semiconductor absorber layer out of the photovoltaic device through a second transparent contact layer. The second percentage of the light further passes through a buffering transport layer interfacing with either the first transparent contact layer or the second transparent contact layer as indicated at 690. In this particular embodiment, either the first transparent contact layer or the second transparent contact layer, whichever does not interface with the buffering transport layer, comprises a non-sputter-deposited transparent contact layer while the remaining transparent contact layer (i.e., the contact layer that does interface with the buffering transport layer) comprises a sputter-deposited transparent conducting oxide layer, also as indicated at block 690.

It should be understood that methods 600 and 650 may be implemented in conjunction with any of the embodiments described above with respect to FIGS. 1-5. As such, elements of method 600 and 650 may be used in conjunction with, in combination with, or substituted for elements of those embodiments described above. Further, the functions, structures and other description of elements for such embodiments described above may apply to like named elements of methods 600 and 650 and vice versa.

In one example implementation of an embodiment disclosed by this specification, a 6"×6" sample was provided consisting of a glass substrate, coated with ITO (forming a bottom TCO) and ZnO (forming an electron transport layer), both of which were patterned with a P1-type scribe, and a bulk heterojunction (providing an organic semiconductor absorber layer). This sample was then coated with a buffering hole-transport layer, comprising a custom aqueous PEDOT:PSS formulation with 0.5 wt. % solids Clevios PH1000, 5 wt. % DMSO, and 0.25 wt. % each of Dynol 604 and Zonyl FS300 surfactants. The PEDOT was coated using a sheet-to-sheet slot-die coating system at a coating speed of 1 m/min, with a coating gap of 40-60 μm and a flow rate of 2-3 mL/min on the sample pre-heated to ~80° C. The resulting buffering hole-transport layer was ~50-100 nm thick. The sample was then patterned with a P2-type scribe to create a channel down to the ITO for the IZO to form the monolithic series interconnect, and the sample annealed at 120° C. for 5 minutes to remove any residual water.

IZO was then sputter deposited from a ceramic Indium Zinc Oxide target with an Indium:Zinc atomic ratio of 8:2 ("In(0.8)Zn(0.2)O(x)"). The off white rectangular target (2"×11") was mounted to a copper backing plate, which is used to attach it to the sputter source. The deposition of the IZO films was performed in a vacuum chamber with a base pressure, before the sputter gasses are added, below $1.0 \times 10^{-6}$ Torr. The sputter gas mixture consists of Argon and Oxygen, which was added to the system by mixing pure argon and an argon-oxygen gas mixture (1.5 mol % oxygen and 98.5 mol % argon). The total gas flow during deposition was 20.0 sccm, 18.0 sccm pure argon and 2.0 sccm argon-oxygen, and the sputter gas pressure was 5.0 mTorr. To sputter the target 100 W of RF (13.56 MHz) power was used. Using a matching network the reflected power was tuned to 0 W. The IZO was deposited onto the sample at ambient temperature. The sample was mounted into a 7"×7" holder which is oscillated over the target at 1.5 oscillation per minute for 60 minutes to produce an IZO (top TCO, >2000 S/cm) film of 250 nm.

An optional 5×10 mm silver grid to aid in current collection was then deposited by thermal evaporation through separate 5 mm and 10 mm shadow masks. The silver was deposited by resistive heating of silver pellets in a tungsten boat inside a thermal evaporation system with a base pressure, before heating, below $1.0 \times 10^{-6}$ Torr. The power applied was varied to maintain a deposition rate of 0.5-2.0 Å/s, as measured by a quartz crystal microbalance. The sample was mounted into a 7"×7" holder held at a distance of ~36" from the source and rotated at ~2 rotations/min to ensure an even distribution of silver deposited on the sample. The resulting silver grid lines were ~250 nm.

Figure 7:
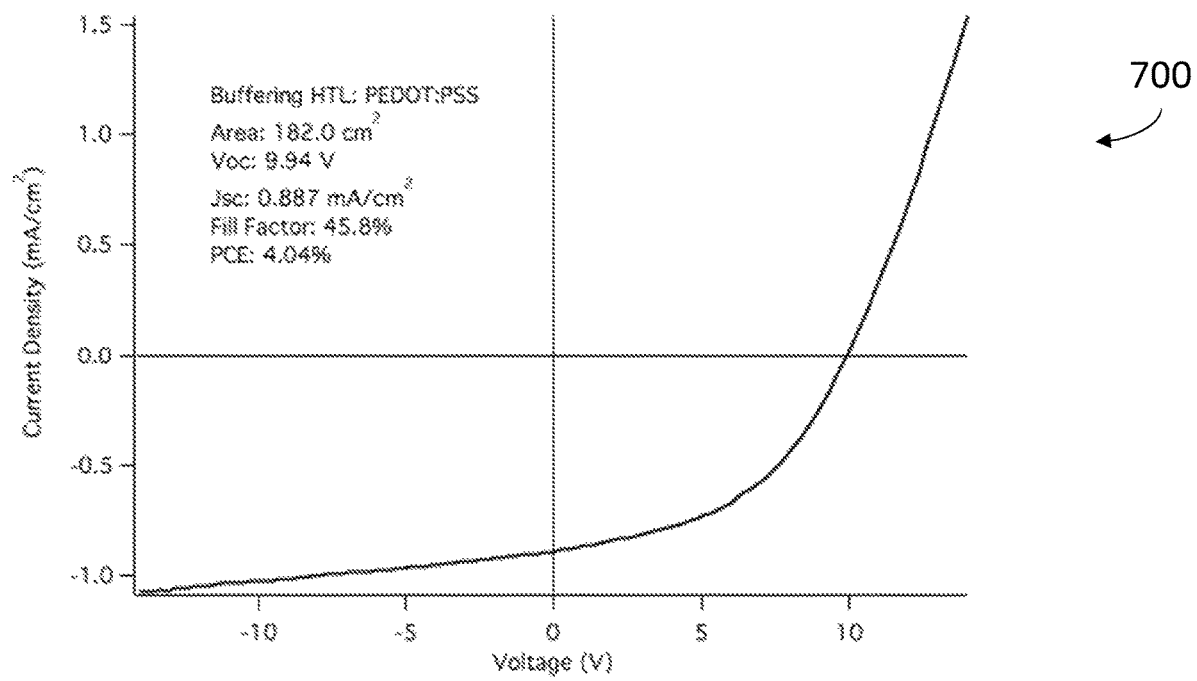
FIG. 7 is a graph illustrating a current density versus voltage (JV) curve for a module of one embodiment of the present disclosure.

The sample was then patterned with a P3-type scribe to isolate the cells and complete the monolithic series-connected module. The active area of 182 cm² was defined via mechanical scribes on the ends, and excess material mechanically removed and bus bar tape applied to aid in current collection. The module was tested under simulated AM1.5 illumination at 1 sun intensity by sweeping the voltage while measuring the current density to produce the JV curve 700 shown in FIG. 7.

Example Embodiments

Example 1 includes an organic semiconductor device, the device comprising: a first contact layer comprising a first sputtered transparent conducting oxide; an electron transport layer interfacing with the first contact layer; a second contact layer comprising a second sputtered transparent conducting oxide; a hole transport layer interfacing with the second contact layer; and an organic semiconductor active layer having a first side facing the electron transport layer and an opposing second side facing the hole transport layer; wherein either the electron transport layer or the hole transport layer comprises a buffering transport layer.

Example 2 includes the device of example 1, wherein the buffering transport layer comprises a transparent polymer material, a semi-transparent polymer material, a transparent oxide material or semi-transparent oxide material.

Example 3 includes the device of any of examples 1-2, wherein the organic semiconductor active layer comprises an either an organic bulk heterojunction structure or a bilayer structure.

Example 4 includes the device of any of examples 1-3, wherein the organic semiconductor active layer comprises an organic bulk heterojunction absorber layer.

Example 5 includes the device of any of examples 1-3, wherein the organic semiconductor active layer comprises an organic emissive electroluminescent layer.

Example 6 includes the device of any of examples 1-5, wherein the first sputter-deposited transparent conducting oxide and the second sputtered transparent conducting oxide both comprise sputtered indium zinc oxide (IZO).

Example 7 includes the device of any of examples 1-6, wherein at least one of the first sputtered transparent conducting oxide or the second sputtered transparent conducting oxide comprise at least one of: sputtered indium zinc oxide (IZO); sputtered indium tin oxide (ITO); sputtered aluminum doped zinc oxide (AZO); or sputtered gallium doped zinc oxide (GZO).

Example 8 includes the device of any of examples 1-7, further comprising a substrate layer adjacent to either the first contact layer or the second contact layer.

Example 9 includes a method for fabricating an organic semiconductor device, the method comprising: applying a buffering transport layer over an organic semiconductor active layer of the organic semiconductor device; and sputter depositing a conductive material layer onto the buffering transport layer.

Example 10 includes the method of example 9, wherein the organic semiconductor active layer comprises either an organic bulk heterojunction structure or a bilayer structure.

Example 11 includes the method of any of examples 9-10, wherein applying the buffering transport layer comprises applying either a transparent or semi-transparent polymer material, or a transparent or semi-transparent oxide material.

Example 12 includes the method of any of examples 9-11, wherein applying the buffering transport layer comprises either a vapor deposition or solution deposition of the buffering transport layer.

Example 13 includes the method of any of examples 9-12, wherein sputter depositing the conductive material layer further comprises: sputter-depositing a transparent conducting oxide onto the buffering transport layer.

Example 14 includes the method of any of examples 9-13, wherein the sputtered transparent conducting oxide comprises a sputtered indium zinc oxide (IZO).

Example 15 includes the method of any of examples 9-14, wherein the sputtered transparent conducting oxide comprises one of an indium zinc oxide (IZO), an indium tin oxide (ITO), an aluminum doped zinc oxide (AZO); or a gallium doped zinc oxide (GZO).

Example 16 includes the method of any of examples 9-15, further comprising: sputter depositing a back contact layer onto a substrate; depositing a charge transport layer over the back contact layer; and depositing the organic semiconductor active layer over the charge transport layer.

Example 17 includes an organic semiconductor device, the device comprising: a substrate; one or more backside device layers adjacent to the substrate; an organic semiconductor active layer having an interface with the one or more backside device layers; a buffering transport layer applied over the organic semiconductor active layer; and a sputtered transparent material contact layer applied over the buffering transport layer.

Example 18 includes the device of example 17, wherein either one or both of the substrate or the one or more backside device layers are opaque.

Example 19 includes the device of any of examples 17-18, wherein the sputtered transparent material contact layer comprises a sputtered transparent conducting oxide.

Example 20 includes the device of example 19, wherein the sputtered transparent conducting oxide comprises a sputtered indium zinc oxide (IZO).

Example 21 includes the device of any of examples 17-20, wherein the buffering transport layer comprises either a transparent or semi-transparent polymer material or a transparent or semi-transparent oxide material.

Example 22 includes the device of any of examples 17-21, wherein the organic semiconductor active layer comprises either an organic bulk heterojunction structure or a bilayer structure.

Example 23 includes an organic photovoltaic module, the module comprising: a plurality of electrically interconnected organic photovoltaic cells applied to a common substrate, wherein each of the plurality of electrically interconnected organic photovoltaic cells comprises: a backside transparent contact layer; a backside collection layer interfacing with the backside transparent contact layer; an organic semiconductor absorber layer; a front side buffering collection layer applied over the organic semiconductor absorber layer; and a sputtered transparent material contact layer applied over the buffering transport layer.

Example 24 includes the module of example 23, wherein the common substrate is semi-transparent in the visible light spectrum.

Example 25 includes the module of any of examples 23-24, wherein the front side buffering collection layer is a hole collection layer comprising either a transparent or semi-transparent polymer material or a transparent or semi-transparent metal oxide material; and wherein the backside collection layer is an electron collection layer.

Example 26 includes the module of any of examples 23-25, wherein the sputtered transparent material contact layer comprises a sputtered transparent conducting oxide.

Example 27 includes the module of example 23-36, wherein the sputtered transparent conducting oxide comprises a sputtered indium zinc oxide (IZO).

Example 28 includes the module of any of examples 23-27, wherein at least one of the backside transparent contact layer or the sputtered transparent material contact layer comprise at least one of: sputtered indium zinc oxide (IZO); sputtered indium tin oxide (ITO); sputtered aluminum doped zinc oxide (AZO); or sputtered gallium doped zinc oxide (GZO).

Example 29 includes the module of any of examples 23-28, wherein the organic semiconductor absorber layer comprises either an organic bulk heterojunction structure or a bilayer structure.

Example 30 includes a method for photovoltaic generation of electricity, the method comprising: collecting light into a photovoltaic device through a first sputter-deposited transparent conducting oxide layer; generating an electrical current with an organic semiconductor absorber layer of the photovoltaic device through photovoltaic conversion of a first percentage of the light having wavelengths outside of the visible light spectrum while passing through the organic semiconductor absorber layer a second percentage of the light having wavelengths within the visible light spectrum; and passing the second percentage of the light as received from the organic semiconductor absorber layer out of the photovoltaic device through a second sputter-deposited transparent conducting oxide layer; wherein the second percentage of the light further passes through a buffering transport layer interfacing with either the first sputter-deposited transparent conducting oxide layer or the second sputter-deposited transparent conducting oxide layer.

Example 31 includes the method of example 30, wherein the first sputtered transparent conducting oxide layer comprises a front transparent contact layer that comprises sputtered indium zinc oxide (IZO).

Example 32 includes the method of any of examples 30-31, wherein the organic semiconductor absorber layer comprises either an organic bulk heterojunction structure or a bilayer structure.

Example 33 includes a method for photovoltaic generation of electricity, the method comprising: collecting light into a photovoltaic device through a first transparent contact layer; generating an electrical current with an organic semiconductor absorber layer of the photovoltaic device through photovoltaic conversion of a first percentage of the light having wavelengths outside of the visible light spectrum while passing through the organic semiconductor absorber layer a second percentage of the light having wavelengths within the visible light spectrum; and passing the second percentage of the light as received from the organic semiconductor absorber layer out of the photovoltaic device through a second transparent contact layer; wherein the second percentage of the light further passes through a buffering transport layer interfacing with either the first transparent contact layer or the second transparent contact layer; and wherein either the first transparent contact layer or the second transparent contact layer, whichever does not interface with the buffering transport layer, comprises a non-sputter-deposited transparent contact layer and whichever does interface with the buffering transport layer, comprises a sputter-deposited transparent conducting oxide layer.

Example 34 includes a device comprising in order: a front contact layer comprising a sputter-deposited transparent conducting oxide; a buffering transport layer; and an organic semiconductor active layer.

Example 35 includes a method comprising: sputter-depositing a contact layer onto a buffering transport layer and an organic semiconductor active layer, wherein the buffering transport layer is between the contact layer and the organic semiconductor active layer.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the embodiments described herein. Therefore, it is manifestly intended that embodiments of the present disclosure be limited only by the claims and the equivalents thereof.

What is claimed is:

1. An organic semiconductor device, the device comprising:
    a first contact layer comprising a first sputter-deposited transparent conducting oxide;
    an electron transport layer interfacing with the first contact layer;
    a second contact layer comprising a second sputter-deposited transparent conducting oxide;
    a hole transport layer interfacing with the second contact layer;
    an organic semiconductor active layer having a first side facing the electron transport layer and an opposing second side facing the hole transport layer; and
    a plurality of scribes that extend into the electron transport layer, the hole transport layer, and the organic semiconductor active layer;
    wherein either the electron transport layer or the hole transport layer comprises a buffering transport layer;
    wherein either the first sputter-deposited transparent conducting oxide or the second sputter-deposited transparent conducting oxide extends into the plurality of scribes and is configured to electrically connect the first contact layer on a first side of each of the plurality of scribes to the second contact layer on a second side of each of the plurality of scribes.

2. The device of claim 1, wherein the buffering transport layer comprises a transparent polymer material, a semi-transparent polymer material, a transparent oxide material or semi-transparent oxide material.

3. The device of claim 1, wherein the organic semiconductor active layer comprises either an organic bulk heterojunction structure or a bilayer structure.

4. The device of claim 1, wherein the organic semiconductor active layer comprises an organic bulk heterojunction absorber layer.

5. The device of claim 1, wherein the organic semiconductor active layer comprises an organic emissive electroluminescent layer.

6. The device of claim 1, wherein the first sputter-deposited transparent conducting oxide and the second sputter-deposited transparent conducting oxide both comprise sputter-deposited indium zinc oxide (IZO).

7. The device of claim 1, wherein at least one of the first sputter-deposited transparent conducting oxide or the second sputter-deposited transparent conducting oxide comprise at least one of:
sputtered indium zinc oxide (IZO);
sputtered indium tin oxide (ITO);
sputtered aluminum doped zinc oxide (AZO); or
sputtered gallium doped zinc oxide (GZO).

8. The device of claim 1, further comprising a substrate layer adjacent to either the first contact layer or the second contact layer.

9. An organic semiconductor device, the device comprising:
a substrate;
one or more backside device layers adjacent to the substrate;
an organic semiconductor active layer having an interface with the one or more backside device layers;
a buffering transport layer applied over the organic semiconductor active layer;
a plurality of scribes that extend into the buffering transport layer, the organic semiconductor active layer and the one or more backside device layers; and
a sputter-deposited transparent material contact layer applied over the buffering transport layer and into the plurality of scribes, wherein the sputter-deposited transparent material contact layer defines a front contact layer on a first side of each of the plurality of scribes and is configured to electrically connect the front contact layer to a back contact layer within the one or more backside device layers on a second side of each of the plurality of scribes.

10. The device of claim 9, wherein the sputtered transparent material contact layer comprises a sputter-deposited transparent conducting oxide.

11. The device of claim 10, wherein the sputter-deposited transparent conducting oxide comprises a sputtered indium zinc oxide (IZO).

12. The device of claim 9, wherein the buffering transport layer comprises at least one of, a transparent polymer material, a semi-transparent polymer material, a transparent oxide material or semi-transparent oxide material.

13. The device of claim 9, wherein the organic semiconductor active layer comprises either an organic bulk heterojunction structure or a bilayer structure.

14. A device comprising in order:
a front contact layer comprising a sputter-deposited transparent conducting oxide;
a buffering transport layer;
an organic semiconductor active layer; and
a plurality of scribes that extend into the buffering transport layer and the organic semiconductor active layer;
wherein the sputter-deposited transparent conducting oxide is applied over the buffering transport layer and into the plurality of scribes, wherein the sputter-deposited transparent conducting oxide is configured to electrically connect the front contact layer on a first side of each of the plurality of scribes to a back contact layer on a second side of each of the plurality of scribes.

* * * * *